(12) United States Patent
Mirzaei (10) Patent No.: US 9,488,698 B2
(45) Date of Patent: Nov. 8, 2016

(54) SYSTEM AND METHOD FOR DETECTING DIODE FAILURES

(71) Applicant: Caterpillar Global Mining Equipment LLC, Denison, TX (US)

(72) Inventor: Saeid Mirzaei, Muskego, WI (US)

(73) Assignee: Caterpillar Global Mining Equipment LLC, Denison, TX (US)

( * ) Notice: Subject to any disclaimer, the term of this patent is extended or adjusted under 35 U.S.C. 154(b) by 176 days.

(21) Appl. No.: 14/549,257

(22) Filed: Nov. 20, 2014

(65) Prior Publication Data

US 2016/0146902 A1    May 26, 2016

(51) Int. Cl.
G01R 31/40      (2014.01)
G01R 19/165    (2006.01)

(52) U.S. Cl.
CPC ............. G01R 31/40 (2013.01); G01R 19/165 (2013.01)

(58) Field of Classification Search
CPC ...... G01R 31/40; G01R 31/42; G01R 31/34; G01R 31/343; G01R 31/346
See application file for complete search history.

(56) References Cited

U.S. PATENT DOCUMENTS

| | | | |
|---|---|---|---|
| 4,021,703 A | 5/1977 | Gary et al. | |
| 5,126,678 A | 6/1992 | Williams | |
| 5,243,489 A | 9/1993 | Dougherty | |
| 5,270,640 A | 12/1993 | Kohler et al. | |
| 6,822,839 B2 | 11/2004 | Habetler | |
| 7,929,323 B2 | 4/2011 | Schmidt | |
| 7,956,762 B2 | 6/2011 | Bailey et al. | |
| 7,994,798 B2 | 8/2011 | Williams et al. | |
| 8,339,810 B2 | 12/2012 | Ratnaparkhi et al. | |
| 8,410,739 B2 | 4/2013 | Hendrickson et al. | |
| 8,626,372 B2 | 1/2014 | Kumar et al. | |
| 8,760,094 B2 | 6/2014 | Solodovnik et al. | |
| 2004/0196678 A1 | 10/2004 | Yoshimura et al. | |
| 2009/0296777 A1* | 12/2009 | Fish | H02P 29/0088 374/152 |
| 2010/0066294 A1* | 3/2010 | Hendrickson | B60L 3/0023 318/490 |
| 2014/0168827 A1 | 6/2014 | Mirzaei | |
| 2014/0211344 A1 | 7/2014 | Pence et al. | |

OTHER PUBLICATIONS

GE Digital Energy, "Transformer Protection Principles," Mar. 2007, pp. 45-50, downloaded from https://www.gedigitalenergy.com/smartgrid/Mar07/article5.pdf on Nov. 20, 2014.
Arendse, "Principles of Differential Relaying," 115 pp., downloaded from https://www.engineersaustralia.org.au/ on Nov. 20, 2014.

* cited by examiner

*Primary Examiner* — Tung X Nguyen
(74) *Attorney, Agent, or Firm* — Leydig, Voit & Mayer, Ltd.

(57) ABSTRACT

A system for detecting faults in a rectifier includes an AC current generator and a rectifier. A controller is configured to determine an AC input current supplied to rectifier, generate a simulated rectified DC input current based upon the AC input current, and determine a DC output current from the rectifier. The controller is further configured to compare the simulated rectified DC input current to the DC output current and generate an alert command if a difference between the simulated rectified DC input current and the DC output current exceeds a predetermined difference threshold.

20 Claims, 6 Drawing Sheets

SYSTEM AND METHOD FOR DETECTING DIODE FAILURES

TECHNICAL FIELD

This disclosure relates generally to AC power rectification systems and, more particularly, to a system and method for detecting the failure of one or more diodes within a rectifier.

BACKGROUND

Machines that utilize electric power often include a power generation system having a prime mover and a generator for generating the electrical power. The generator may be configured as an alternator that generates AC electrical power. In many instances, it is desirable to convert the AC electrical power into DC power through the use of a rectifier system.

A fault within an AC power generation system may result in the unbalanced generation of AC power that may damage components of the power generation system. In one example, certain types of faults may result in overheating of the windings of one or more phases within an alternator. Once a fault has been detected, a technician is often called upon to locate and fix the fault and return the machine to operation.

Systems have been developed to assist the technician by determining the type of fault that has occurred within the power generation system. For example, a sequence transformer system may be utilized to transform the output of the alternator into a positive sequence of phasors, a negative sequence of phasors, and a zero sequence of phasors. Properties of the sequences may be analyzed using symmetrical component analysis to determine the type of fault that has occurred. For example, certain properties may indicate a ground fault and other properties may indicate a fault between phases. In addition, other properties may indicate the number of phases between which a fault has occurred.

Knowing the type of fault may reduce the time required for a technician to locate and thus fix the fault. However, the sequence transformer system may not identify the location of the fault within the power generation system. As a result, a technician may be required to spend a considerable amount of time attempting to identify the specific location of the fault.

Relay protection systems may be used to determine whether a fault has occurred in an electrical component and to shut down the current to the component or other systems to protect the component and the systems. Differential relays often operate by comparing the input current to the output current and triggering the relay if the difference exceeds a threshold for a predetermined time. The difficulty in using a relay to monitor the operation of a rectifier is increased due to the different forms of input and output current (i.e., AC current and DC current, respectively).

U.S. Pat. No. 7,994,798 discloses a power generation system that includes an alternator and a rectifier for converting AC power to DC power. Current sensors may be used to measure the DC current that is provided to the electric motors of a traction system. A system is provided to test the current sensors by comparing a measured current with a stored profile. The test results may be used to assist in determining the location of a fault.

The foregoing background discussion is intended solely to aid the reader. It is not intended to limit the innovations described herein, nor to limit or expand the prior art discussed. Thus, the foregoing discussion should not be taken to indicate that any particular element of a prior system is unsuitable for use with the innovations described herein, nor is it intended to indicate that any element is essential in implementing the innovations described herein. The implementations and application of the innovations described herein are defined by the appended claims.

SUMMARY

In one aspect, a system for detecting faults in a rectifier includes an AC current generator for generating an AC output current and a rectifier including at least one diode operatively connected to receive the AC output current to define an AC input current to the rectifier and transform the AC input current into a DC output current. A first current sensor is configured to generate first current signals indicative of the AC input current and an output current sensor is configured for generating output current signals indicative of the DC output current. A controller is configured to store a predetermined difference threshold, receive the first current signals from the first current sensor, determine the AC input current based upon the first current signals, and generate a simulated rectified DC input current based upon the AC input current. The controller is further configured to receive the output current signals from the output current sensor, determine the DC output current based upon the output current signals, compare the simulated rectified DC input current to the DC output current, and generate an alert command if a difference between the simulated rectified DC input current and the DC output current exceeds the predetermined difference threshold.

In another aspect, a controller-implemented method of detecting faults in a rectifier having at least one diode includes storing a predetermined difference threshold, generating an AC output current, providing the AC output current to the rectifier to define an AC input current, and transforming the AC input current into a DC output current through the rectifier. The method further includes receiving first current signals from a first current sensor indicative of the AC input current, determining the AC input current to the rectifier based upon the first current signals, and generating a simulated rectified DC input current based upon the AC input current. The method also includes receiving output current signals from an output current sensor indicative of the DC output current from the rectifier, determining the DC output current based upon the output current signals, comparing the simulated rectified DC input current to the DC output current, and generating an alert command if a difference between the simulated rectified DC input current and the DC output current exceeds the predetermined difference threshold.

In still another aspect, a machine includes an AC current generator for generating an AC output current, a prime mover operatively connected to the AC current generator, and a rectifier including at least one diode operatively connected to receive the AC output current to define an AC input current to the rectifier and transform the AC input current into a DC output current. A first current sensor is configured to generate first current signals indicative of the AC input current and an output current sensor is configured for generating output current signals indicative of the DC output current. A controller is configured to store a predetermined difference threshold, receive the first current signals from the first current sensor, determine the AC input current based upon the first current signals, and generate a simulated rectified DC input current based upon the AC input current. The controller is further configured to receive the output current signals from the output current sensor, determine the DC output current based upon the output current signals, compare the simulated rectified DC input current to the DC output current, and generate an alert command if a difference between the simulated rectified DC input current and the DC output current exceeds the predetermined difference threshold.

DETAILED DESCRIPTION

Figure 1:
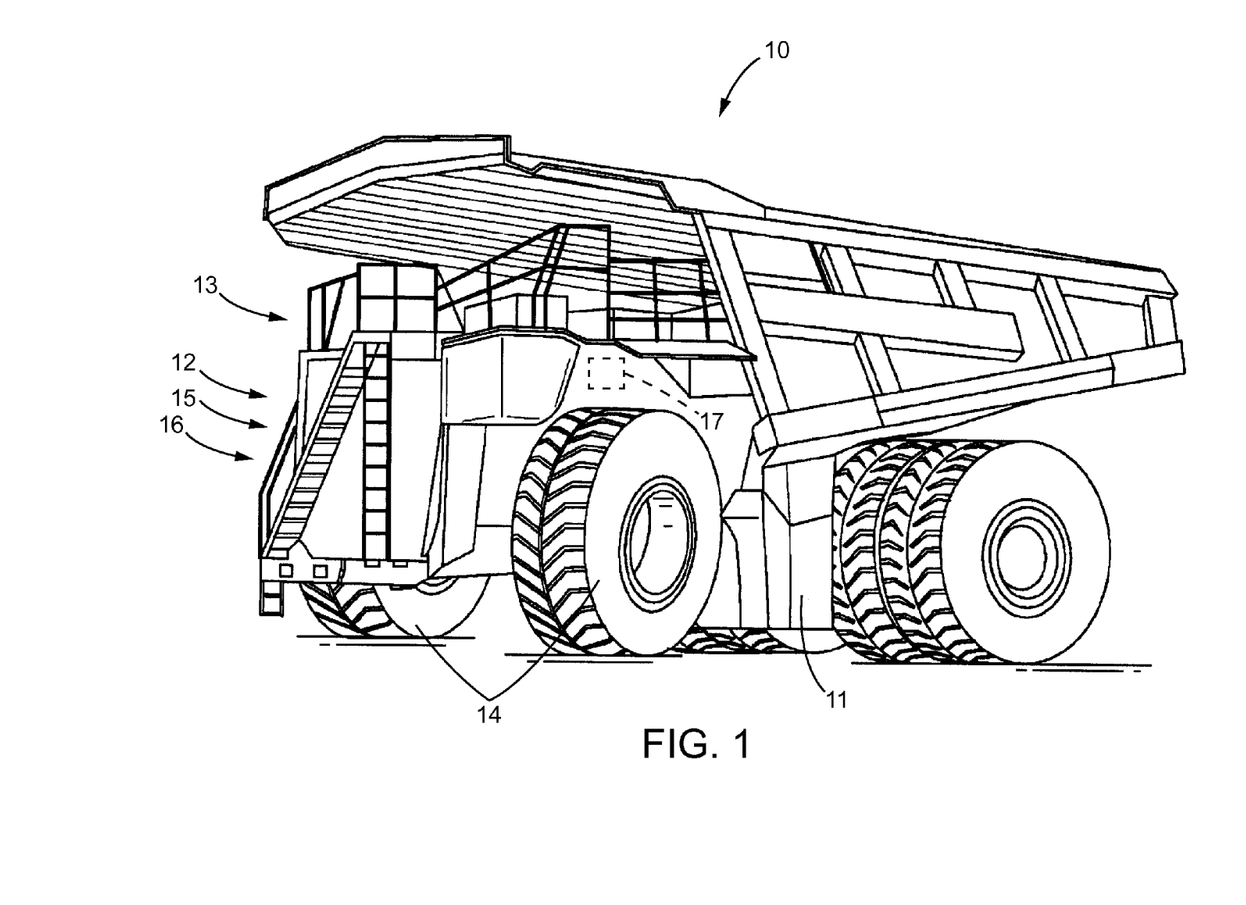
FIG. 1 is a perspective view of a machine in which the principles disclosed herein may be used.

FIG. 1 is a diagrammatic illustration of a machine 10 that may be used in accordance with an embodiment of the disclosure. The machine 10 may include a chassis 11 that supports a prime mover such as an engine 12 and a cab 13 in which an operator may be positioned. The engine 12 may be operatively connected to and drives one or more ground engaging drive mechanisms such as wheels 14. More specifically, engine 12 may be operatively connected to an AC current generator or alternator 20 (FIG. 2) to energize two inverter systems (not shown). The inverter systems may supply current to two electric motors (not shown) to drive the wheels 14.

A control system 15 as shown generally by an arrow in FIG. 1 indicating association with the machine 10 may be provided to control the operation of the machine. The control system 15 may include a plurality of sensors as shown generally by arrow 16 and an electronic control module such as controller 17. The plurality of sensors 16 may operate by providing data or signals indicative, directly or indirectly, of the performance or conditions of various aspects of the machine 10. The controller 17 may receive operator input command signals and control the operation of the various systems of the machine 10.

The controller 17 may be an electronic controller that operates in a logical fashion to perform operations, execute control algorithms, store and retrieve data and other desired operations. The controller 17 may include or access memory, secondary storage devices, processors, and any other components for running an application. The memory and secondary storage devices may be in the form of read-only memory (ROM) or random access memory (RAM) or integrated circuitry that is accessible by the controller. Various other circuits may be associated with the controller such as power supply circuitry, signal conditioning circuitry, driver circuitry, and other types of circuitry.

The controller 17 may be a single controller or may include more than one controller disposed to control various functions and/or features of the machine 10. The term "controller" is meant to be used in its broadest sense to include one or more controllers and/or microprocessors that may be associated with the machine 10 and that may cooperate in controlling various functions and operations of the machine. The functionality of the controller 17 may be implemented in hardware and/or software without regard to the functionality. The controller 17 may rely on one or more data maps relating to the operating conditions of the machine 10 that may be stored in the memory of controller. Each of these maps may include a collection of data in the form of tables, graphs, and/or equations. The controller 17 may use the data maps to maximize the performance and efficiency of the machine 10.

Figure 2:
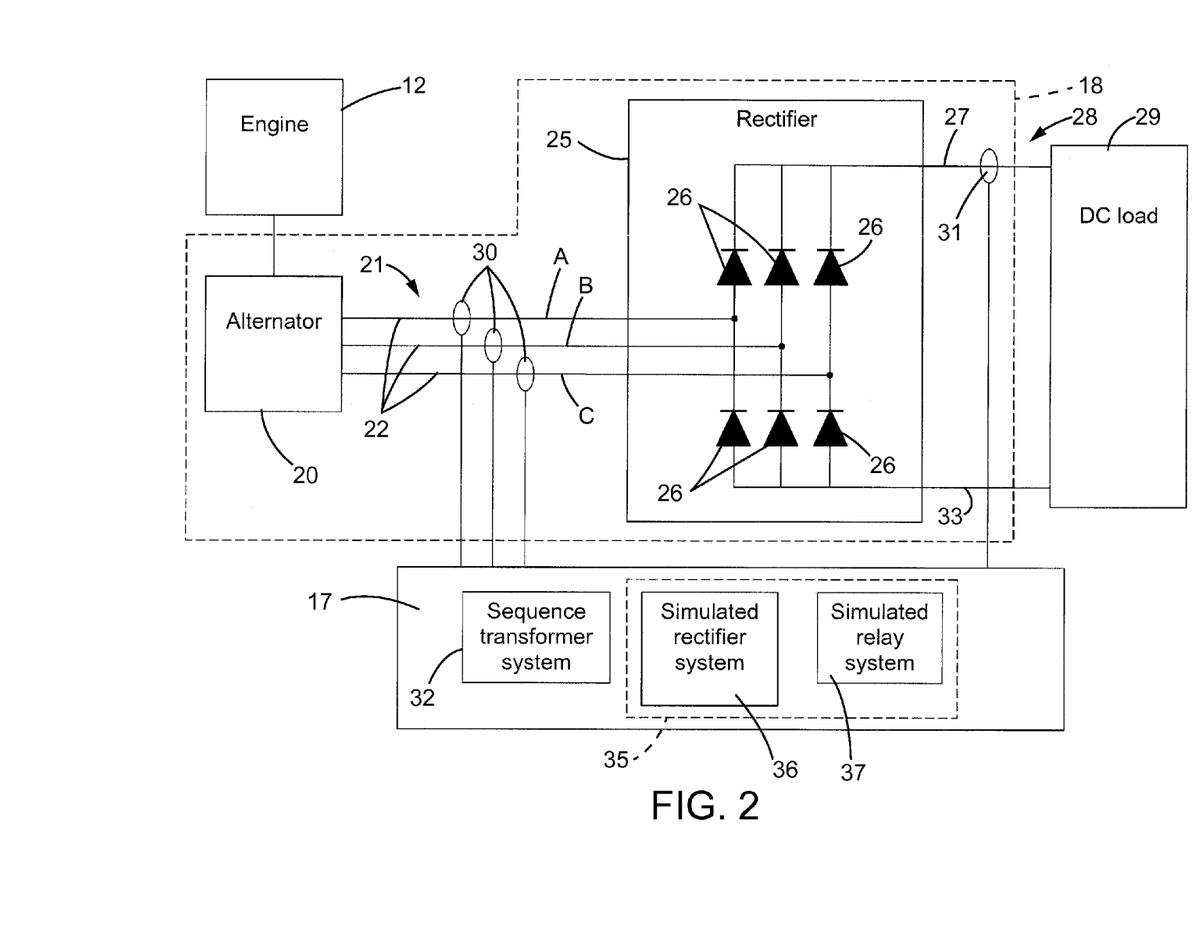
FIG. 2 is a block diagram of a portion of the machine of FIG. 1 including a power generation system.

Referring to FIG. 2, a block diagram of a portion of machine 10 is depicted including the engine 12 operatively connected to a three-phase power generation system 18 that includes alternator 20 that generates alternating voltage. An AC bus 21 is operatively connected to alternator 20 and includes three power lines 22 (such as cables) depicted as a first phase power line A for conducting the first phase of the electricity from the alternator 20, a second phase power line B for conducting the second phase of the electricity from the alternator, and a third phase power line C for conducting the third phase of the electricity from the alternator. As depicted, alternator 20 generates three-phase electrical energy including three-phase AC output current with one phase or phase A of AC output current being transmitted along the first phase power line A, a second phase or phase B being transmitted along the second phase power line B, and a third phase or phase C being transmitted along the third phase power line C.

The power lines 22 conduct AC output current from alternator 20 to rectifier 25. Rectifier 25 may include a plurality of diodes 26 or other electronic devices and is configured to convert AC current to DC current. As depicted, rectifier 25 includes six diodes 26 with two diodes connected in series to each phase of the AC bus 21 as a three-phase full-wave bridge rectifier circuit. Rectifier 25 is configured to convert the AC input current (which is AC output current from the alternator 20) to a single DC output current that is provided along a single DC output line 27 (such as a cable) to DC bus 28. DC bus 28 may be operatively connected to a DC load 29 such as the inverters (not shown) used to convert DC power to AC power to drive the wheels 14 of the machine 10. A DC return line 33 extends from the DC load 29 to the rectifier 25.

Although depicted as having three phases, the alternator 20 and rectifier 25 may have any desired number of phases. In addition, in some instances, rectifier 25 may have other configurations.

Each phase of the power lines 22 may include a current sensor 30 associated therewith for measuring the AC input current through the respective power lines. Accordingly, a first current sensor, a second current sensor, and a third current sensor are depicted in FIG. 2. In addition, the DC output line 27 may also include an output current sensor 31 for measuring the output current exiting from the rectifier 25. Each of the current sensors 30 and the output current sensor 31 may be part of control system 15 and are operatively connected to controller 17 to provide current data or current signals to the controller. The current sensors 30 and the output current sensor 31 may be any type of sensor that will measure the current through the respective lines. The controller 17 may determine the AC input current in power lines 22 based upon current signals from current sensors 30 and the DC output current in DC output line 27 based upon current signals from the output current sensor 31. In one example, the current sensors 30 and the output current sensor 31 may be Hall effect sensors. Other types of sensors may also used. For example, when measuring the current in the AC power lines 22, the current sensors 30 may be current transformers.

Under most circumstances, the power generation system 18 may operate as desired and the current generated by alternator 20 and conducted by power lines 22 to rectifier 25 may operate in a balanced manner (i.e., the current along each power line is equal and the phases displaced or separated by equal angles). However, in some instances, the power generation system 18 may operate in an unbalanced manner which may be indicative of a problem within the system. In order to assist in locating problems within the power generation system 18, controller 17 may include a sequence transformer system 32 as is known in the art that operates to transform the characterization of the output of the alternator 20 into a positive sequence of phasors, a negative sequence of phasors, and a zero sequence of phasors. More specifically and using the current generated by the alternator 20 as an example, the sequence transformer system 32 resolves the generated current into a positive sequence set of equal currents ($I_1$) that is displaced and rotates according to the output current along each power line 22, a negative sequence set of equal currents ($I_2$) that is displaced and rotates in a direction opposite the positive sequence, and a zero sequence set of equal currents ($I_0$) in which has a zero phase displacement from the others.

According to symmetrical component analysis, the presence of only positive sequence currents indicates a balanced power system within the phases. In such case, the negative sequence and the zero sequence currents are equal to zero. If the negative sequence currents are not equal to zero, a fault such as a short circuit exists on or between one of the phases. If the zero sequence currents are not equal to zero, a ground fault exists between one or more of the phases and a ground reference.

While the sequence transformer system 32 will identify the type of fault within an electrical system, a significant amount of work by a technician may be required to find the exact location of the fault as it may exist anywhere within the system. Accordingly, the controller 17 may include a diode failure detection system 35 that operates to determine whether a fault that is identified is located within or outside the rectifier 25.

The diode failure detection system 35 may include a simulated rectifier system 36 and a simulated relay system 37. The simulated rectifier system 36 operate by determining the actual AC input current to the rectifier and generating a simulated rectified DC input current based upon such AC input current. More specifically, referring to the flowchart in FIG. 3, the controller 17 may receive at stage 40 current sensor data or current signals from each current sensor 30 associated with the power lines 22. At stage 41, the controller 17 may determine the current in each power line 22 based upon the current sensor data from each current sensor 30.

Figure 3:
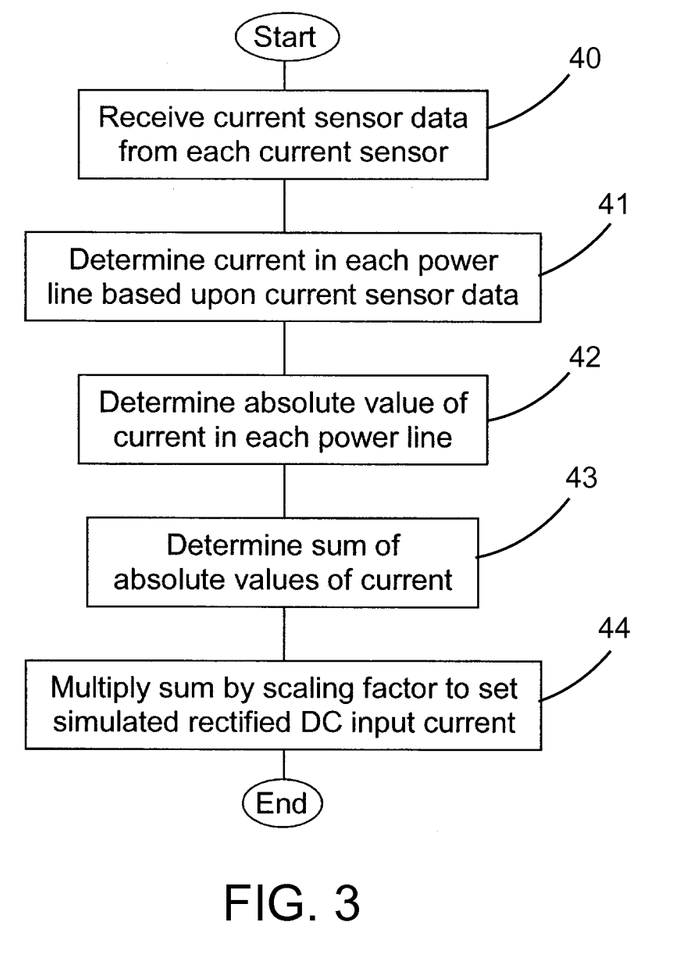
FIG. 3 is a flowchart of a simulated rectifier system.

The controller 17 may determine at stage 42 the absolute value of the current within each power line 22 based upon the data from each current sensor 30. The controller 17 may add the absolute values of the currents together at stage 43. If desired, a scaling factor may be applied at stage 44 to the sum of the absolute values of the currents to create a simulated rectified DC input current that more accurately reflects the actual amount of current that would be rectified if a second physical rectifier were operatively connected to the output from the current sensors 30 associated with the power lines 22. In the example depicted in FIG. 2 with a three-phase system, a scaling factor of 0.5 may be used with the sum of the absolute values being multiplied by the scaling factor. Other scaling factors may also be used.

The simulated relay system 37 may operate in a manner similar to a conventional physical relay system (not shown) in which the actual input current flowing into and the actual output current flowing out of a device are compared to determine whether the component is operating properly. More specifically, the simulated relay system 37 may compare the simulated rectified DC input current determined by the simulated rectifier system 36 to the actual DC output current determined by the output current sensor 31 on the DC output line 27 exiting the rectifier 25. If the difference between the simulated rectifier DC input current and the DC output current is greater than a predetermined difference threshold for longer than a threshold period of time, the controller 17 may simulate tripping or actuating a relay. The controller 17 may generate an alert command to an operator of the machine 10, store an error code within the controller, shut down one or more components of the machine or the entire machine, and/or take any other desired actions.

The difference threshold may be set to any desired value based upon the desired sensitivity of the simulated relay system 37. While theoretically any difference between the input current and the output current may indicate a fault, a non-zero difference threshold is typically preferred to avoid tripping or actuating the relay based upon errors or tolerances that may occur during operation that are not related to a fault within the relay. In one example in which the rated current of the alternator is 950 A, the difference threshold may be set to 5 A which is approximately 0.5% of the rated current. In other applications, other thresholds may be used. For example, a if a greater sensitivity is desired, the difference threshold may be as low as 0.1 to 0.3% of the rated current.

The threshold period of time may be set to ensure that a fault has occurred before tripping or actuating the relay. In one example, the threshold period of time may be set at twenty milliseconds. Other threshold periods of time may be used depending on the desired sensitivity of the simulated relay system 37.

By combining the sequence transformer system 32 with the diode failure detection system 35, the controller 17 may determine the type of fault within the power generation system 18 and also determine whether the fault is within the rectifier 25 or outside of the rectifier such as within the alternator 20 or along the power lines 22.

Figure 4:
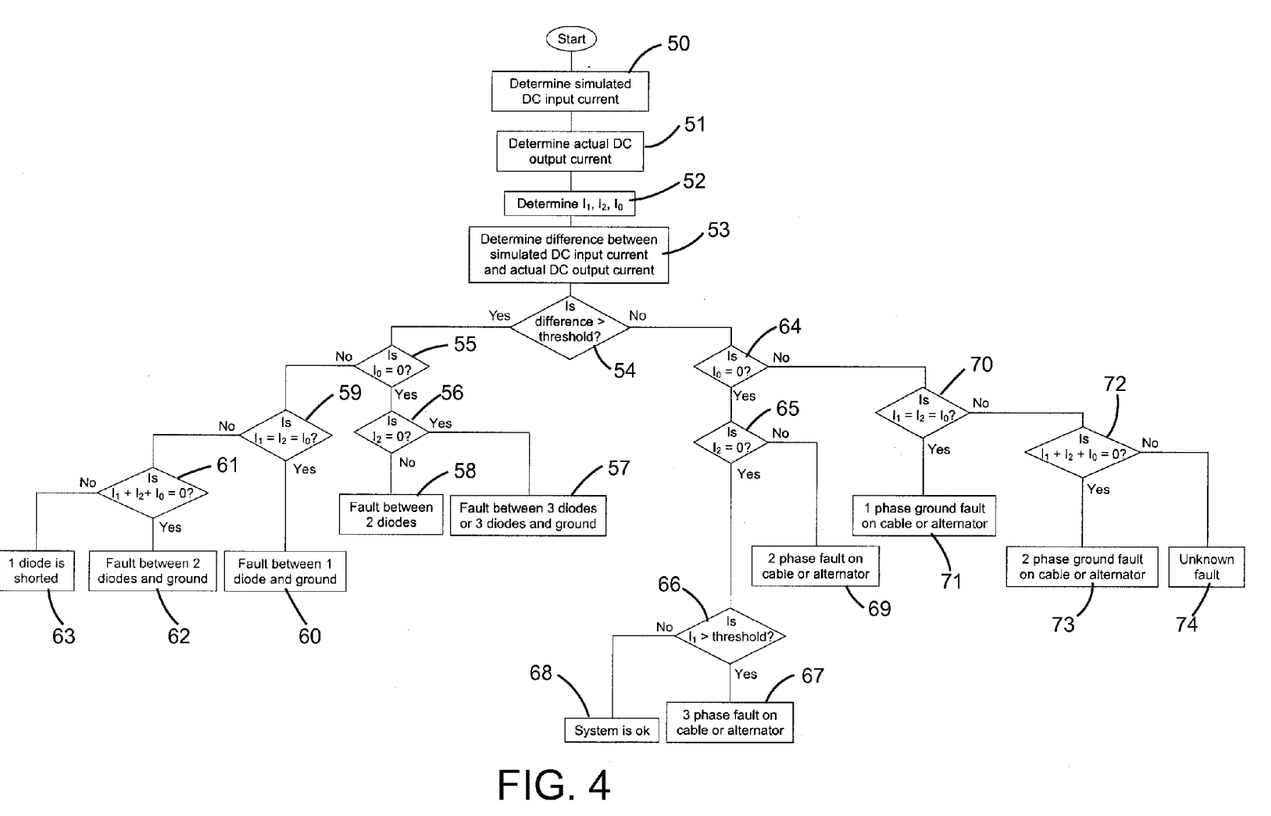
FIG. 4 is a flowchart of a process for determining the type and location of a fault within a three-phase power generation system.

Referring to FIG. 4, a flowchart is depicted of a process for determining the type of fault within the three-phase power generation system 18 and whether the fault is within the rectifier or outside of the rectifier. At stage 50, the controller 17 may analyze the AC input current delivered to the rectifier 25 over power lines 22 and determine the equivalent or simulated DC input current to the rectifier as described above with respect to FIG. 3.

At stage 51, the controller 17 may receive data from the output current sensor 31 associated with the DC output line 27 and determine the actual DC output current exiting from the rectifier 25 along the DC output line. At stage 52, the controller 17 may perform a symmetrical component analysis on the current passing through each power line 22 to determine the positive sequence set of equal currents $I_1$, the negative sequence set of equal currents $I_2$, and the zero sequence set of equal currents $I_0$.

The simulated relay system 37 of controller 17 may determine at stage 53 the difference between the simulated DC input current and the actual DC output current. At decision stage 54, the simulated relay system 37 may determine whether the difference between the simulated DC input current and the actual DC output current is greater than a difference threshold for a duration that exceeds a threshold period of time.

If the difference between the simulated DC input current and the actual DC output current exceeds the difference and time threshold at decision stage 54, a fault exists in the rectifier circuit within rectifier 25. At decision stage 55, the controller 17 may determine whether the zero sequence set of equal currents $I_0$ is equal to zero. If the zero sequence set of equal currents $I_0$ is zero, the controller 17 may determine at decision stage 56 whether the negative sequence set of equal currents $I_2$ is equal to zero. If the negative sequence set of equal currents $I_2$ is equal to zero, the fault within the rectifier 25 may be either between the diodes of three phases or between the diodes of the three phases and also a ground reference as depicted at stage 57. If the negative sequence set of equal currents $I_2$ is not equal to zero, the fault within the rectifier 25 is between the diodes of two of the phases as depicted at stage 58.

If the zero sequence set of equal currents $I_0$ is not equal to zero at decision stage 55, the controller 17 may determine at decision stage 59 whether the positive sequence set of equal currents $I_1$, the negative sequence set of equal currents $I_2$, and the zero sequence set of equal currents $I_0$ are all equal. If the positive sequence set of equal currents $I_1$, the negative sequence set of equal currents $I_2$, and the zero sequence set of equal currents $I_0$ are all equal, the fault within the rectifier 25 is between one of the diodes and the ground reference as depicted at stage 60. If the positive sequence set of equal currents $I_1$, the negative sequence set of equal currents $I_2$, and the zero sequence set of equal currents $I_0$ are not all equal at decision stage 59, the controller 17 may determine at decision stage 61 whether the sum of the positive sequence set of equal currents $I_1$, the negative sequence set of equal currents $I_2$, and the zero sequence set of equal currents $I_0$ equals zero. If the sum of the positive sequence set of equal currents $I_1$, the negative sequence set of equal currents $I_2$, and the zero sequence set of equals currents $I_0$ equals zero, the fault within the rectifier 25 is between two of the diodes and also the ground reference as depicted at stage 62. If the sum of the positive sequence set of equal currents $I_1$, the negative sequence set of equal currents $I_2$, and the zero sequence set of equal currents $I_0$ does not equal zero, the fault within the rectifier 25 is that one of the diodes is shorted as depicted at stage 63.

Referring back to decision stage 54, if the simulated DC input current and the actual DC output current are within the difference and time thresholds, the power generation system 18 may be working properly or a fault may exist outside of the rectifier 25. At decision stage 64, the controller 17 may determine whether the zero sequence set of equal currents $I_0$ is equal to zero. If the zero sequence set of equal currents $I_0$ is zero, the controller 17 may determine at decision stage 65 whether the negative sequence set of equal currents $I_2$ is equal to zero. If the negative sequence set of equal currents $I_2$ is equal to zero, the controller 17 may determine at decision stage 66 whether the positive sequence set of equal currents $I_1$ is greater than a threshold current level or value. The threshold current level may be set at any desired value that defines a threshold as to whether the power generation system 18 is operating properly. As an example, if the alternator 20 is rated at 950 A, the threshold current level may be set at 1900 A. In such case, it may be expected that the power generation system 18 may be operating properly if the current at times exceeds 950 A but is less than 1900 A.

If the positive sequence set of equal currents $I_1$ is greater than the threshold current level at decision stage 66, a fault exists between the three phases on either the alternator 20 or the power lines 22 as depicted at stage 67. If the positive sequence set of equal currents $I_1$ is less than the threshold current level, no faults exist in the alternator 20 or the power lines 22 and the power generation system 18 is operating properly as depicted at 68. If the negative sequence set of equal currents $I_2$ is not equal to zero at decision stage 65, a fault exists within either the alternator 20 or the power lines 22 and the fault is between two of the phases as depicted at stage 69.

If the zero sequence set of equal currents $I_0$ is not equal to zero at decision stage 64, the controller 17 may determine at decision stage 70 whether the positive sequence set of equal currents $I_1$, the negative sequence set of equal currents $I_2$, and the zero sequence set of equal currents $I_0$ are all equal. If the positive sequence set of equal currents $I_1$, the negative sequence set of equal currents $I_2$, and the zero sequence set of equal currents $I_0$ are all equal, a ground fault exists between one phase of either the alternator 20 or the power lines 22 and the ground reference as depicted at stage 71. If the positive sequence set of equal currents $I_1$, the negative sequence set of equal currents $I_2$, and the zero sequence set of equal currents $I_0$ are not all equal at decision stage 70, the controller 17 may determine at decision stage 72 whether the sum of the positive sequence set of equal currents $I_1$, the negative sequence set of equal currents $I_2$, and the zero sequence set of equal currents $I_0$ equals zero. If the sum if the positive sequence set of equal currents $I_1$, the negative sequence set of equal currents $I_2$, and the zero sequence set of equal currents $I_0$ equals zero, a ground fault exists between two phases of either the alternator 20 or the power lines 22 and the ground reference as depicted at stage 73. If the sum of the positive sequence set of equal currents $I_1$, the negative sequence set of equal currents $I_2$, and the zero sequence set of equal currents $I_0$ does not equal zero, there is an unknown fault as depicted at stage 74.

Figure 5:
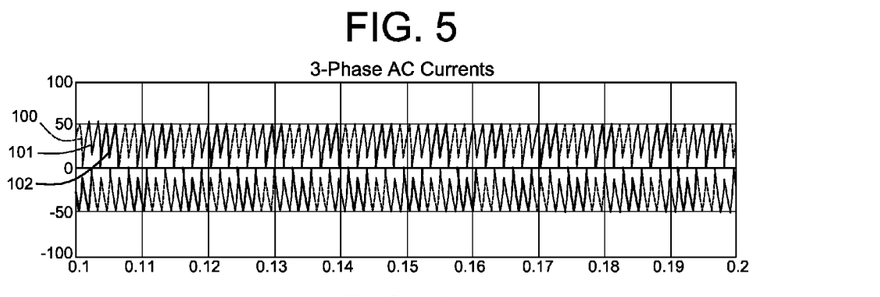
FIG. 5 is an exemplary graph of a simulation of three-phase AC input currents generated by an alternator.
Figure 6:
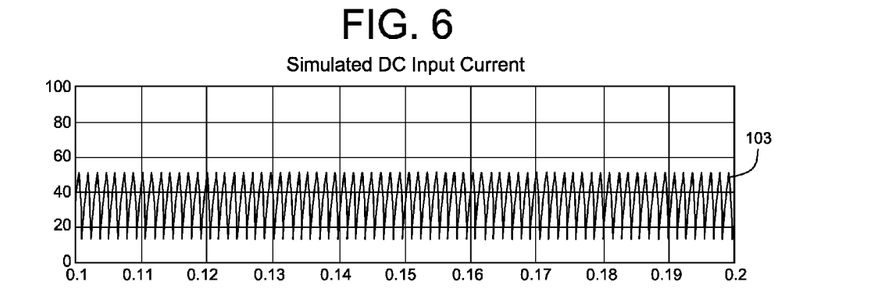
FIG. 6 is an exemplary graph of a simulated rectified DC input current based upon the AC input currents of FIG. 5.
Figure 7:
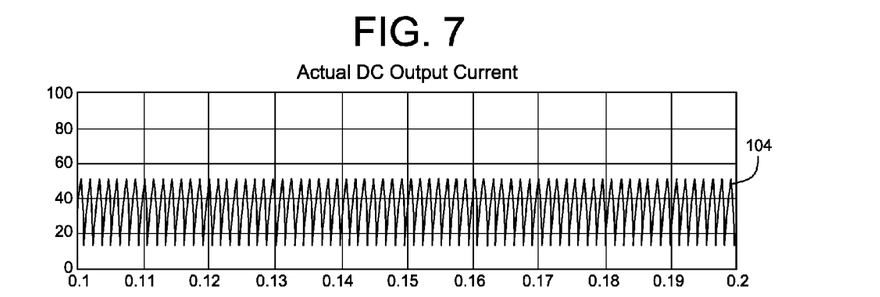
FIG. 7 is an exemplary graph of a simulation of a DC output current from a rectifier based upon the input current of FIG. 5.
Figure 8:
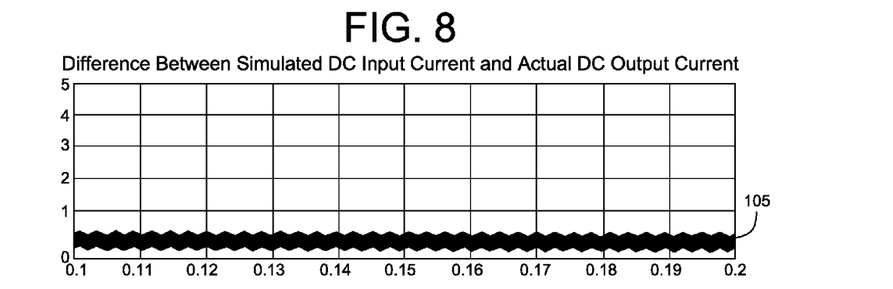
FIG. 8 is an exemplary graph of a difference between the simulated rectified DC input current of FIG. 6 and the simulation of the DC output current of FIG. 7.

FIGS. 5-8 depict a simulation of a first example of stages 50-54 in which the power generation system 18 has no faults and is operating in a balanced manner. FIG. 5 depicts a simulation of the current in each power line 22 with the first phase power line A depicted at 100, the second phase power line B depicted at 101, and the third phase power line C depicted at 102. An example of the simulated DC input current determined at stages 40-44 of FIG. 3 is depicted at 103 in FIG. 6. An example of the DC output current from rectifier 25 is depicted at 104 in FIG. 7. FIG. 8 depicts that the difference 105 between the simulated DC input current 103 and the DC output current 104 is essentially zero and thus there are no faults in the rectifier 25.

Upon determining that a fault does not exist in the rectifier 25, the controller 17 may utilize symmetrical component analysis to determine whether a fault exists elsewhere within the power generation system 18 (such as within the alternator 20 or the power lines 22) and, if so, the type of fault by following stages 64-74. It should be noted that the symmetrical component analysis will not identify whether a fault exists in the alternator 20 or the power lines 22 but only that a fault exists within the power generation system 18. Further, based upon the analysis of the difference between the simulated DC input current and the DC input current in this simulation, it is known that any such fault is not within the rectifier 25.

Figure 9:
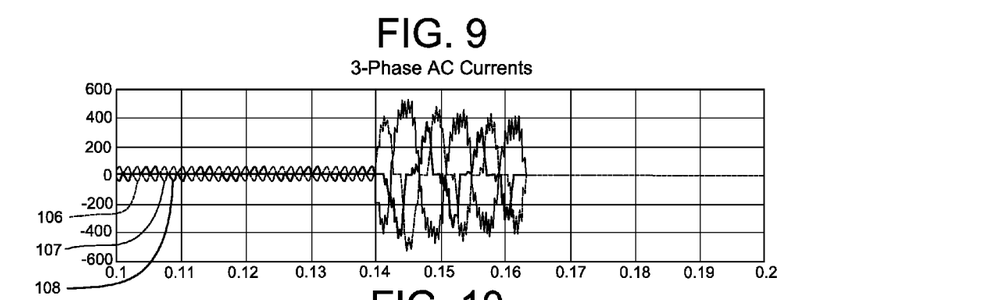
FIG. 9 is an exemplary graph of a second simulation of three-phase AC input currents generated by an alternator.
Figure 10:
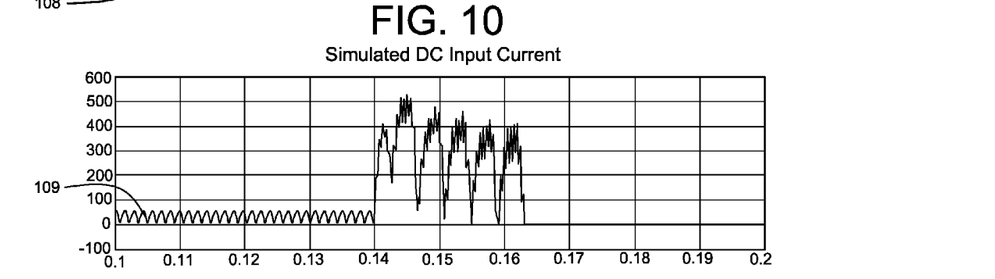
FIG. 10 is an exemplary graph of a simulated rectified DC input current based upon the AC input currents of FIG. 9.
Figure 11:
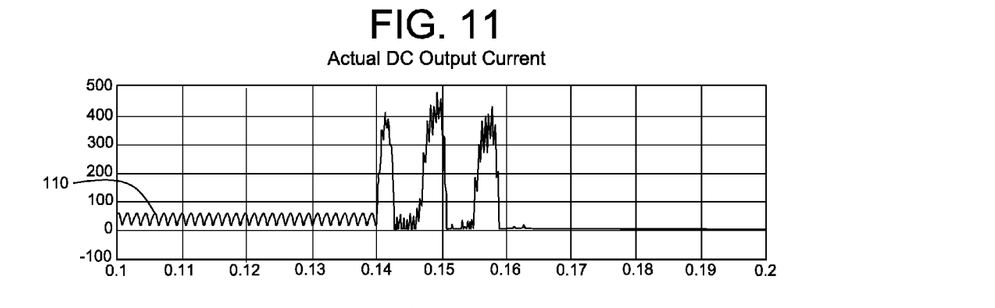
FIG. 11 is an exemplary graph of a simulation of a DC output current from a rectifier based upon the input current of FIG. 9.
Figure 12:
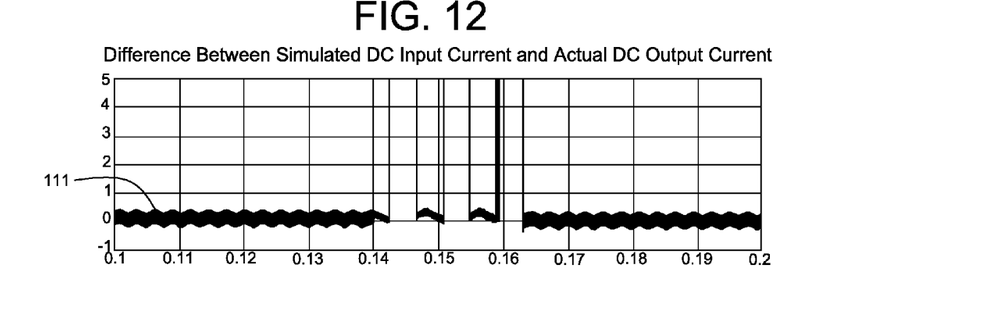
FIG. 12 is an exemplary graph of a difference between the simulated rectified DC input current of FIG. 10 and the simulation of the DC output current of FIG. 11.

FIGS. 9-12 depict a simulation of a second example of stages 50-54 in which the power generation system 18 has a fault between one of the phases within the rectifier 25 and a ground reference and thus the system is operating in an unbalanced manner. FIG. 9 depicts a simulation of the current in each power line 22 with the first phase power line A depicted at 106, the second phase power line B depicted at 107, and the third phase power line C depicted at 108. An example of the simulated DC input current determined at stages 40-44 of FIG. 3 is depicted at 109 in FIG. 10. An example of the DC output current is depicted at 110 in FIG. 11. FIG. 12 depicts the difference 111 between the simulated DC input current 109 and the DC output current 110 which exceeds the difference and time thresholds and therefore a fault exists within the rectifier 25.

Upon determining that a fault exists in the rectifier 25, the controller 17 may utilize symmetrical component analysis to determine the type of fault within the rectifier by following stages 55-63.

Although depicted in FIG. 4 and described herein in the context of currents and sums of currents being equal or equal to zero, the controller 17 may not require exact equivalence so as to compensate for tolerances associated with the power generation system 18. More specifically, the operation of the sequence transformer system 32 and the diode failure detection system 35 may not require exact equivalence. More specifically, the systems may utilize various non-zero thresholds rather than requiring exact equivalence.

Referring to FIG. 4, the simulated relay system 37 may be configured to require a difference between the simulated DC input current and the actual DC output current to exceed at decision stage 54 a predetermined non-zero threshold or difference threshold. As depicted in FIGS. 8 and 12, the simulated relay system 37 is configured to trip or activate the simulated relay if the difference between the simulated DC input current and the DC output current exceeds 5 A. In the simulated examples of FIGS. 5-8 and 9-12, the alternator 20 is rated at 950 A and therefore the difference threshold is set at approximately 0.5% of the rated current. If a more sensitive simulated relay were desired, the simulated relay system 37 may be configured to trip or activate the simulated relay with a smaller difference threshold such as 1 to 3 A which is approximately 0.1-0.3% of the rated current.

In one example, at decision stages 55 and 64, the threshold for the zero sequence set of equal currents $I_0$ may be set at approximately 10% of the rated current. In another example, at decision stages 56 and 65, the threshold for the negative sequence set of equal currents $I_2$ may be set at approximately 5% of the rated current. Either larger and smaller thresholds may be utilized for the zero sequence set of equal currents $I_0$ and/or the negative sequence set of equal currents $I_2$ in some situations.

In still another example, at decision stages 59 and 70, the condition of the decision stages may be met if the positive sequence set of equal currents $I_1$, the negative sequence set of equal currents $I_2$, and the zero sequence set of equal currents $I_0$ are all within or do not vary by more than approximately 5-10%. While larger and smaller thresholds are possible, in some instances a range of approximately 20% may be too large. In a further example, at decision stages 61 and 72, the condition of the decision stages may be met if the sum of the positive sequence set of equal currents $I_1$, the negative sequence set of equal currents $I_2$, and the zero sequence set of equal currents $I_0$ is within approximately 5% of the rated current.

INDUSTRIAL APPLICABILITY

The industrial applicability of the system described herein will be readily appreciated from the foregoing discussion. The foregoing discussion is applicable to machines that include a rectifier 25 as part of a power generation system 18.

Symmetrical component analysis may be used to determine the type of fault within a power generation system 18. However, a technician may need to spend a significant amount of time locating the fault even once aware of the type of fault. The diode failure detection system 35 may be used to determine whether a fault within the power generation system 18 is within the rectifier circuit or outside of the rectifier 25 such as within the alternator 20 or the power lines 22. Determining whether a fault is within the rectifier may reduce the time required to locate and repair the fault and return the machine 10 to operation.

It will be appreciated that the foregoing description provides examples of the disclosed system and technique. However, it is contemplated that other implementations of the disclosure may differ in detail from the foregoing examples. All references to the disclosure or examples thereof are intended to reference the particular example being discussed at that point and are not intended to imply any limitation as to the scope of the disclosure more generally. All language of distinction and disparagement with respect to certain features is intended to indicate a lack of preference for those features, but not to exclude such from the scope of the disclosure entirely unless otherwise indicated.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context.

Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

The invention claimed is:

1. A system for detecting faults in a rectifier comprising:
    an AC current generator for generating an AC output current;
    a rectifier operatively connected to receive the AC output current to define an AC input current to the rectifier and transform the AC input current into a DC output current, the rectifier including at least one diode;
    a first current sensor for generating first current signals indicative of the AC input current;

an output current sensor for generating output current signals indicative of the DC output current;
a controller configured to:
store a predetermined difference threshold;
receive the first current signals from the first current sensor;
determine the AC input current based upon the first current signals;
generate a simulated rectified DC input current based upon the AC input current;
receive the output current signals from the output current sensor;
determine the DC output current based upon the output current signals;
compare the simulated rectified DC input current to the DC output current; and
generate an alert command if a difference between the simulated rectified DC input current and the DC output current exceeds the predetermined difference threshold.

2. The system of claim 1, wherein the AC current generator generates three-phase AC output current including a first phase, a second phase, and a third phase.

3. The system of claim 2, further including a second current sensor and a third current sensor, and wherein the first current sensor is operatively connected to the first phase, the second current sensor is operatively connected to the second phase, and the third current sensor is operatively connected to the third phase.

4. The system of claim 2, wherein the rectifier includes a three-phase full wave bridge rectifier circuit.

5. The system of claim 2, wherein the rectifier transforms the three-phase AC input current into a single DC output current along a single DC output line.

6. The system of claim 2, wherein the controller is further configured to determine a sum of an absolute value of the first phase, the second phase, and the third phase of the AC output current.

7. The system of claim 6, wherein the controller is further configured to apply a scaling factor to the sum before comparing the simulated rectified DC input current to the DC output current.

8. The system of claim 2, wherein the controller is further configured to determine a positive sequence set of equal currents, a negative sequence set of equal currents, and a zero sequence set of equal currents based upon the AC input current, and determine whether a short circuit exists in one of a plurality of diodes of the rectifier based upon the positive sequence set of equal currents, the negative sequence set of equal currents, and the zero sequence set of equal currents.

9. The system of claim 1, wherein the AC current generator is an alternator.

10. The system of claim 1, wherein controller is further configured to store a threshold period of time and generate the alert command if the difference exceeds the predetermined difference threshold for longer than the threshold period of time.

11. The system of claim 1, wherein the rectifier including a plurality of diodes and the controller is further configured to determine a positive sequence set of equal currents, a negative sequence set of equal currents, and a zero sequence set of equal currents based upon the AC input current, and determine whether a short circuit exists in one of the plurality of diodes based upon the positive sequence set of equal currents, the negative sequence set of equal currents, and the zero sequence set of equal currents.

12. A controller-implemented method of detecting faults in a rectifier including at least one diode, comprising:
storing a predetermined difference threshold;
generating an AC output current;
providing the AC output current to the rectifier to define an AC input current;
transforming the AC input current into a DC output current through the rectifier;
receiving first current signals from a first current sensor indicative of the AC input current;
determining the AC input current to the rectifier based upon the first current signals;
generating a simulated rectified DC input current based upon the AC input current;
receiving output current signals from an output current sensor indicative of the DC output current from the rectifier;
determining the DC output current based upon the output current signals;
comparing the simulated rectified DC input current to the DC output current; and
generating an alert command if a difference between the simulated rectified DC input current and the DC output current exceeds the predetermined difference threshold.

13. The method of claim 12, further including generating three-phase AC input current including a first phase, a second phase, and a third phase.

14. The method of claim 13, further including receiving second current signals from a second current sensor indicative of an AC input current of the second phase, determining the AC input current of the second phase based upon the second current signals, receiving third current signals from a third current sensor indicative of an AC input current of the third phase, and determining the AC input current of the third phase based upon the third current signals.

15. The method of claim 13, further including determining a sum of an absolute value of the first phase, the second phase, and the third phase of the AC output current.

16. The method of claim 15, further including applying a scaling factor to the sum before comparing the simulated rectified DC input current to the DC output current.

17. The method of claim 13, further including determining a positive sequence set of equal currents, a negative sequence set of equal currents, and a zero sequence set of equal currents based upon the AC input current, and determining whether a short circuit exists in one of a plurality of diodes based upon the positive sequence set of equal currents, the negative sequence set of equal currents, and the zero sequence set of equal currents.

18. The method of claim 12, further including storing a threshold time and generating the alert command if the difference exceeds the predetermined difference threshold for longer than the threshold time.

19. The method of claim 12, wherein the rectifier including a plurality of diodes and the controller is further configured to determine a positive sequence set of equal currents, a negative sequence set of equal currents, and a zero sequence set of equal currents based upon the AC input current, and determine whether a short circuit exists in one of the plurality of diodes based upon the positive sequence set of equal currents, the negative sequence set of equal currents, and the zero sequence set of equal currents.

20. A machine comprising:
an AC current generator for generating an AC output current;
a prime mover operatively connected to the AC current generator;

a rectifier operatively connected to receive the AC output current to define an AC input current to the rectifier and transform the AC input current into a DC output current, the rectifier including at least one diode;

a first current sensor for generating first current signals indicative of the AC input current;

an output current sensor for generating output current signals indicative of the DC output current;

a controller configured to:
- store a predetermined difference threshold;
- receive the first current signals from the first current sensor;
- determine the AC input current based upon the first current signals;
- generate a simulated rectified DC input current based upon the AC input current;
- receive the output current signals from the output current sensor;
- determine the DC output current based upon the output current signals;
- compare the simulated rectified DC input current to the DC output current; and
- generate an alert command if a difference between the simulated rectified DC input current and the DC output current exceeds the predetermined difference threshold.

* * * * *